United States Patent
Yu et al.

(10) Patent No.: US 9,971,214 B2
(45) Date of Patent: May 15, 2018

(54) ARRAY SUBSTRATE STRUCTURE AND MANUFACTURING METHOD THEREOF

(71) Applicants: Shenzhen China Star Optoelectronics Technology Co., Ltd., Shenzhen (CN); Wuhan China Star Optoelectronics Technology Co., Ltd., Wuhan (CN)

(72) Inventors: Xiaojiang Yu, Shenzhen (CN); Haibo Du, Shenzhen (CN)

(73) Assignees: SHENZHEN CHINA STAR OPTOELECTRONIC TECHNOLOGY CO., LTD., Shenzhen, Guangdong (CN); WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 0 days. days.

(21) Appl. No.: 15/694,860

(22) Filed: Sep. 4, 2017

(65) Prior Publication Data

US 2017/0363902 A1    Dec. 21, 2017

Related U.S. Application Data

(62) Division of application No. 14/764,176, filed on Jul. 29, 2015, now Pat. No. 9,785,023.

(30) Foreign Application Priority Data

May 8, 2015    (CN) .......................... 2015 1 0233736

(51) Int. Cl.
G02F 1/1368    (2006.01)
G02F 1/1343    (2006.01)
G02F 1/1333    (2006.01)
G02F 1/1362    (2006.01)
H01L 27/12    (2006.01)

(52) U.S. Cl.
CPC ........ *G02F 1/13439* (2013.01); *G02F 1/1368* (2013.01); *G02F 1/13338* (2013.01); *G02F 1/133345* (2013.01); *G02F 1/134309* (2013.01); *G02F 1/136286* (2013.01); *H01L 27/124* (2013.01); *G02F 2001/13685* (2013.01); *G02F 2201/121* (2013.01); *G02F 2202/09* (2013.01)

(58) Field of Classification Search
CPC .......................... G02F 1/13338; G02F 1/1368
See application file for complete search history.

(56) References Cited

U.S. PATENT DOCUMENTS

2013/0300968 A1* 11/2013 Okajima ........... G02F 1/136209
                                                    349/43
2014/0054592 A1*  2/2014 Gu .................... G02F 1/134363
                                                    257/71

* cited by examiner

*Primary Examiner* — Marcos D Pizarro
*Assistant Examiner* — Antonio Crite
(74) *Attorney, Agent, or Firm* — Leong C. Lei

(57) ABSTRACT

A manufacturing method of an array substrate structure is disclosed, in which after a common electrode is formed, a reduction resistant layer is first formed on the common electrode before deposition of a second insulation layer in order to prevent the film quality of the common electrode from being affected by a reductive atmosphere generated in a process of directly depositing the second insulation layer on the common electrode thereby reducing the influence on the transmittal of the common electrode caused by the deposition of the second insulation layer on the common electrode and providing the common electrode with increased transmittal and enhancing displaying performance.

6 Claims, 10 Drawing Sheets

ARRAY SUBSTRATE STRUCTURE AND MANUFACTURING METHOD THEREOF

CROSS REFERENCE TO RELATED APPLICATIONS

This is a divisional application of co-pending patent application Ser. No. 14/764,176, filed on Jul. 29, 2015, which is a national stage of PCT Application Number PCT/CN2015/079661, filed on May 25, 2015, claiming foreign priority of Chinese Patent Application Number 201510233736.8, filed on May 8, 2015.

BACKGROUND OF THE INVENTION

1. Field of the Invention

The present invention relates to the field of displaying technology, and in particular to an array substrate structure and a manufacturing method thereof.

2. The Related Arts

A touch screen allows a user to operate a host device by touching a symbol and text displayed on a display screen of a computer. This allows operations to be carried out without of keyboards and mice and provides man-machine interfacing in a more straightforward manner. The major applications are information inquiry in public places, guidance of office operations, electronic games, songs and dishes ordering, multimedia teaching/learning, and advanced sales of airplane and train tickets. Products are generally classified in three categories, including capacitive touch screens, resistive touch screens, and surface acoustic wave touch screens.

An array substrate is an important component of a touch screen panel.

Referring to FIG. 1, a cross-sectional view is given to illustrate a conventional array substrate structure for use with a touch screen panel. The array substrate comprises a base plate 100, a buffer layer 200 formed on the base plate 100, a semiconductor layer 300 formed on the buffer layer 200, a gate insulation layer 410 formed on the buffer layer 200 and the semiconductor layer 300, an interlayer dielectric layer 420 formed on the gate insulation layer 410, a source/drain terminal 500 formed on the interlayer dielectric layer 420, a planarization layer 600 formed on the source/drain terminal 500 and the interlayer dielectric layer 420, a second metal layer 700 formed on the planarization layer 600, a first insulation layer 810 formed on the second metal layer 700 and the planarization layer 600, a common electrode 910 formed on the first insulation layer 810, a second insulation layer 820 formed on the common electrode 910 and the first insulation layer 810, and a pixel electrode 920 formed on the second insulation layer 820.

A first via 510 is formed in the gate insulation layer 410 and the interlayer dielectric layer 420 to correspond to the semiconductor layer 300. A second via 520 is formed in the first insulation layer 810 to correspond to the second metal layer 700. A third via 530 is formed in the planarization layer 600, the first insulation layer 810, and the second insulation layer 820 to correspond to the source/drain terminal 500.

The semiconductor layer 300 comprises a source/drain contact zone 310. The source/drain terminal 500 is set in engagement with the source/drain contact zone 310 of the semiconductor layer 300 through the first via 510. The common electrode 910 is set in engagement with the second metal layer 700 through the second via 520. The pixel electrode 920 is set in engagement with the source/drain terminal 500 through the third via 530.

The second metal layer 700 is provided for connection with a touch sensing electrode.

Specifically, the second insulation layer 820 comprises a material of $SiN_x$ and the common electrode 910 comprises a material of ITO (Indium Tin Oxide).

Specifically, plasma enhanced chemical vapor deposition (PECVD) is used to form second insulation layer 820 ($SiN_x$ layer), of which the reaction is as follows:

$$SiH_4 + N_2 + NH_3 \xrightarrow{\text{RF power}} SiN_x:H + H_2,$$

in other words, $SiH_4$, $NH_3$, and $N_2$ react under an effect of an electromagnetic field generated by radio frequency (RF) power to generate $SiN_x:H$ and $H_2$. The $H_2$ atmosphere generated by the reaction is reductive and may readily cause reduction of a surface layer of the common electrode 910. As shown in FIG. 2, a reduced ITO layer 912 is formed on the surface of the common electrode 910 and an ITO layer 914 is present under the reduced ITO layer. The reduced ITO layer 912 is poor in light transmittance so that the overall light transmittal of the common electrode 910 is lowered down thereby making the overall light transmittance of the touch screen panel reduced and thus affecting the displaying performance of a panel (such as brightness).

Thus, it is desired to provide an array substrate structure and a manufacturing method thereof to overcome the above problems.

SUMMARY OF THE INVENTION

An object of the present invention is to provide an array substrate structure, which comprises a common electrode having improved film quality and has increased transmittal.

An object of the present invention is also to provide a manufacturing method of an array substrate, which reduces the influence on a common electrode caused by deposition of an insulation layer on the common electrode so as to provide the common electrode with increased transmittal and enhance displaying performance.

To achieve the above objects, the present invention provides an array substrate structure, which comprises a base plate, a buffer layer formed on the base plate, a semiconductor layer formed on the buffer layer, a gate insulation layer formed on the buffer layer and the semiconductor layer, an interlayer dielectric layer formed on the gate insulation layer, a source/drain terminal formed on the interlayer dielectric layer, a planarization layer formed on the source/drain terminal and the interlayer dielectric layer, a second metal layer formed on the planarization layer, a first insulation layer formed on the second metal layer and the planarization layer, a common electrode formed on the first insulation layer, a reduction resistant layer formed on the common electrode and the first insulation layer, a second insulation layer formed on the reduction resistant layer, and a pixel electrode formed on the second insulation layer;

wherein a first via is formed in the gate insulation layer and the interlayer dielectric layer to correspond to the semiconductor layer; a second via is formed in the first insulation layer to correspond to the second metal layer; and a third via is formed in the planarization layer, the first insulation layer, the reduction resistant layer, and the second insulation layer to correspond to the source/drain terminal; and the semiconductor layer comprises a source/drain contact zone and the source/drain terminal is set in engagement with the source/drain contact zone of the semiconductor layer through the first via; the common electrode is set in engagement with the second metal layer through the second via; and the pixel electrode is set in engagement with the source/drain terminal through the third via.

The reduction resistant layer comprises a material of composition-variable $SiN_xO_y$, $x≥0$, $0≤y≤2$, in which in a direction from the common electrode to the second insulation layer, x gradually increases from 0 and y gradually decreases from 2 to 0.

The first insulation layer and the second insulation layer comprise a material of $SiN_x$, $x>0$.

The source/drain contact zone of the semiconductor layer comprises a material of N-type heavily-doped silicon; and the common electrode and the pixel electrode both comprise a material of indium tin oxide (ITO).

The present invention also provides an array substrate structure, which comprises a base plate, a buffer layer formed on the base plate, a semiconductor layer formed on the buffer layer, a gate insulation layer formed on the buffer layer and the semiconductor layer, an interlayer dielectric layer formed on the gate insulation layer, a source/drain terminal formed on the interlayer dielectric layer, a planarization layer formed on the source/drain terminal and the interlayer dielectric layer, a second metal layer formed on the planarization layer, a first insulation layer formed on the second metal layer and the planarization layer, a common electrode formed on the first insulation layer, a reduction resistant layer formed on the common electrode and the first insulation layer, a second insulation layer formed on the reduction resistant layer, and a pixel electrode formed on the second insulation layer;

wherein a first via is formed in the gate insulation layer and the interlayer dielectric layer to correspond to the semiconductor layer; a second via is formed in the first insulation layer to correspond to the second metal layer; and a third via is formed in the planarization layer, the first insulation layer, the reduction resistant layer, and the second insulation layer to correspond to the source/drain terminal; and the semiconductor layer comprises a source/drain contact zone and the source/drain terminal is set in engagement with the source/drain contact zone of the semiconductor layer through the first via; the common electrode is set in engagement with the second metal layer through the second via; and the pixel electrode is set in engagement with the source/drain terminal through the third via;

wherein the reduction resistant layer comprises a material of composition-variable $SiN_xO_y$, $x≥0$, $0≤y≤2$, in which in a direction from the common electrode to the second insulation layer, x gradually increases from 0 and y gradually decreases from 2 to 0;

wherein the first insulation layer and the second insulation layer comprise a material of $SiN_x$, $x>0$; and wherein the source/drain contact zone of the semiconductor layer comprises a material of N-type heavily-doped silicon; and the common electrode and the pixel electrode both comprise a material of indium tin oxide (ITO).

The present invention further provides a manufacturing method of an array substrate structure, comprising the following steps:

(1) providing a base plate and depositing a buffer layer on the base plate;

(2) depositing and patterning a semiconductor layer on the buffer layer and subjecting a partial area of the semiconductor layer to N-type heavy doping so as to form a source/drain contact zone for contact engagement with a source/drain terminal;

(3) sequentially depositing a gate insulation layer and an interlayer dielectric layer on the semiconductor layer and subjecting the gate insulation layer and the interlayer dielectric layer to patterning so as to form a first via in the gate insulation layer and the interlayer dielectric layer to correspond to the source/drain contact zone of the semiconductor layer;

(4) depositing and patterning a first metal layer on the interlayer dielectric layer so as to form a source/drain terminal, wherein the source/drain terminal is set in engagement with the source/drain contact zone of the semiconductor layer through the first via;

(5) depositing a planarization layer on the source/drain terminal and the interlayer dielectric layer;

(6) depositing and patterning a second metal layer on the planarization layer;

(7) depositing and patterning a first insulation layer on the second metal layer and the planarization layer so as to form a second via in the first insulation layer to correspond to the second metal layer;

(8) depositing and patterning a first oxide conductive layer on the first insulation layer so as to form a common electrode, wherein the common electrode is set in engagement with the second metal layer through the second via;

(9) depositing a reduction resistant layer on the common electrode and the first insulation layer;

(10) depositing a second insulation layer on the reduction resistant layer and simultaneously subjecting the second insulation layer, the reduction resistant layer, the first insulation layer, and the planarization layer to patterning so as to form a third via in the second insulation layer, the reduction resistant layer, the first insulation layer, and the planarization layer to correspond to the source/drain terminal; and

(11) depositing and patterning a second oxide conductive layer on the second insulation layer so as to form a pixel electrode, wherein the pixel electrode is set in engagement with the source/drain terminal through the third via.

In step (9), plasma enhanced chemical vapor deposition is used to form the reduction resistant layer.

Step (9) comprises:

(91) supplying a gas for deposition of $SiO_2$ to a surface of the common electrode so as to form a $SiO_2$ film; and

(92) slowly cutting off the supply of the gas for deposition of $SiO_2$ and at the same time, gradually conducting a supply of a gas for deposition of $SiN_x$ in such a way that the supply of the gas for deposition of $SiO_2$ is gradually reduced to zero and at the same time, the supply of the gas for deposition of $SiN_x$ is gradually increased so that a composition-variable $SiN_xO_y$ layer, $x≥0$, $0≤y≤2$, is formed on the common electrode, wherein in a direction in which growth is made upward from the common electrode, x increases from 0 and y decreases from 2 to 0, the composition-variable $SiN_xO_y$ layer being the reduction resistant layer.

The gas for deposition of $SiO_2$ comprises tetraethyl orthosilicate (TEOS) and oxygen ($O_2$) and the gas for deposition of $SiN_x$ comprises $SiH_4$, $NH_3$, and $N_2$.

The first insulation layer and the second insulation layer comprises a material of $SiN_x$, $x>0$.

The source/drain contact zone of the semiconductor layer comprises a material of N-type heavily-doped silicon; and the common electrode and the pixel electrode comprise a material of indium tin oxide (ITO).

The efficacy of the present invention is that the present invention provides an array substrate structure, in which a reduction resistant layer is arranged on the common electrode in order to prevent film quality of the common electrode from being affected by a reductive atmosphere generated in a process of directly depositing a second insulation layer on the common electrode and to provide the common electrode with an increased transmittal. The present invention provides a manufacturing method of the array substrate structure, in which after a common electrode is formed, a reduction resistant layer is first formed on the common electrode before deposition of a second insulation layer in order to prevent film quality of the common electrode from being affected by a reductive atmosphere generated in the process of depositing the second insulation layer on the common electrode thereby reducing the influence of the common electrode caused by the deposition of insulation layer on the common electrode and providing the common electrode with an increased transmittal and enhancing displaying performance.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
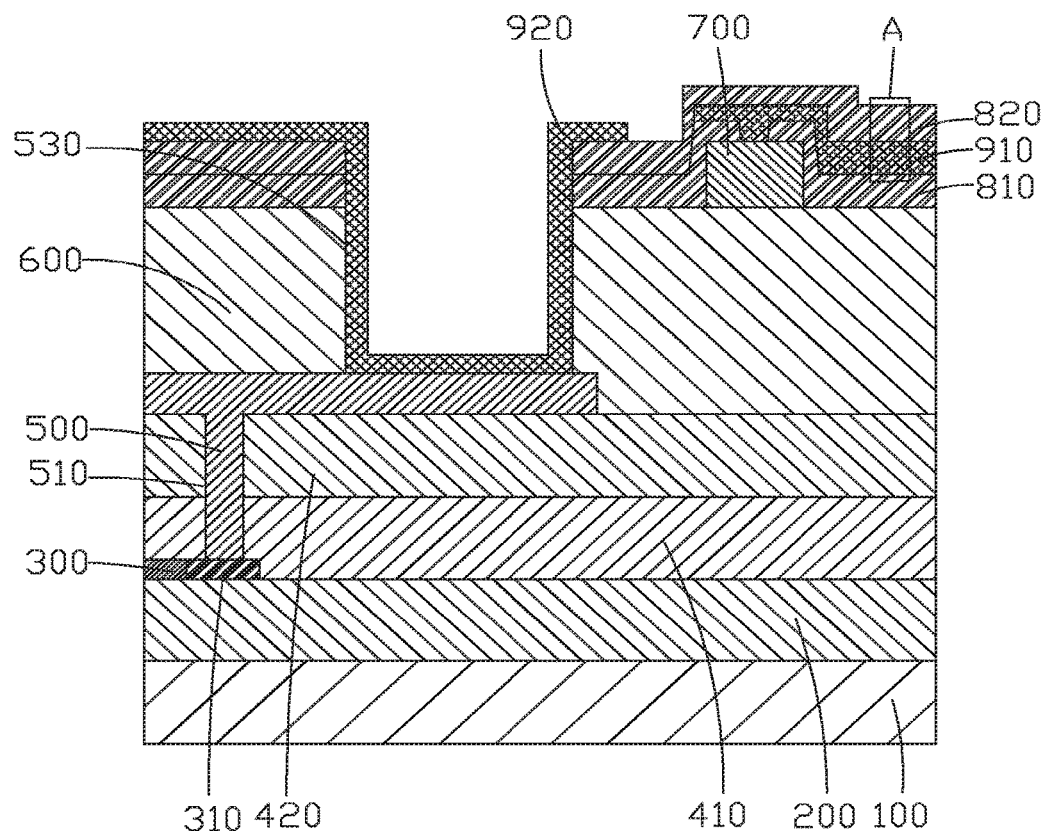
FIG. 1 is a cross-sectional view of a conventional array substrate for use with a touch screen panel.
Figure 2:
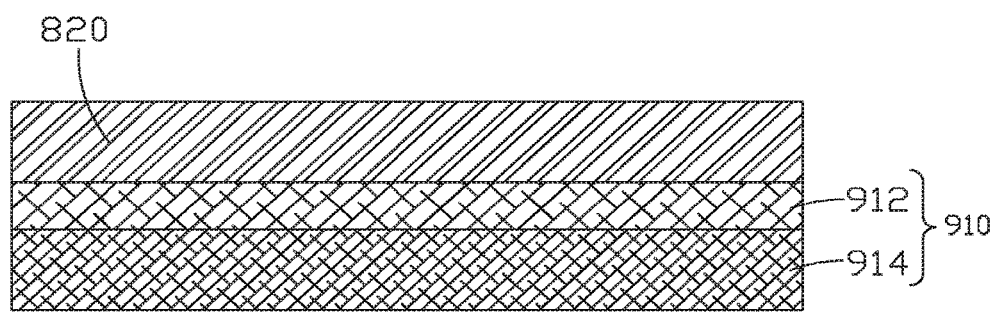
FIG. 2 is an enlarged view of area A of FIG. 1.
Figure 3:
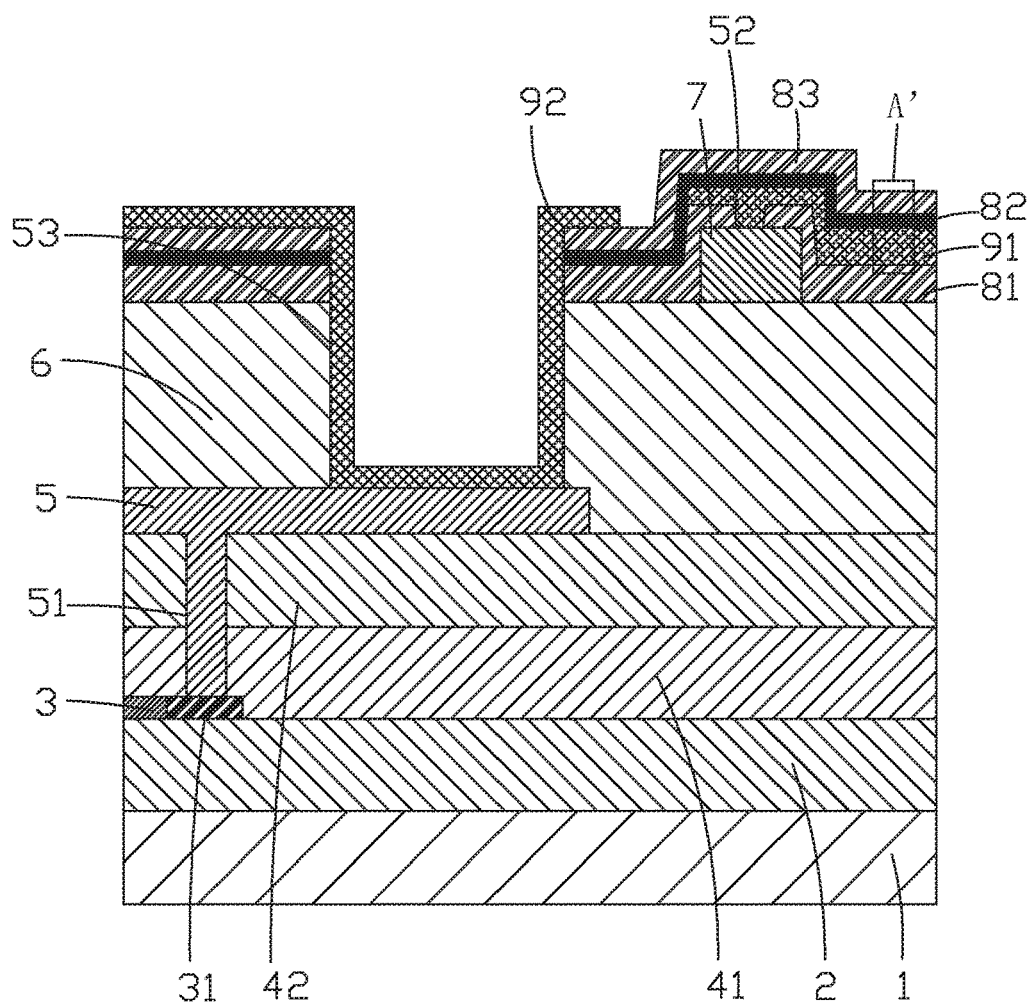
FIG. 3 is a cross-sectional view showing an array substrate structure according to the present invention.
Figure 4:
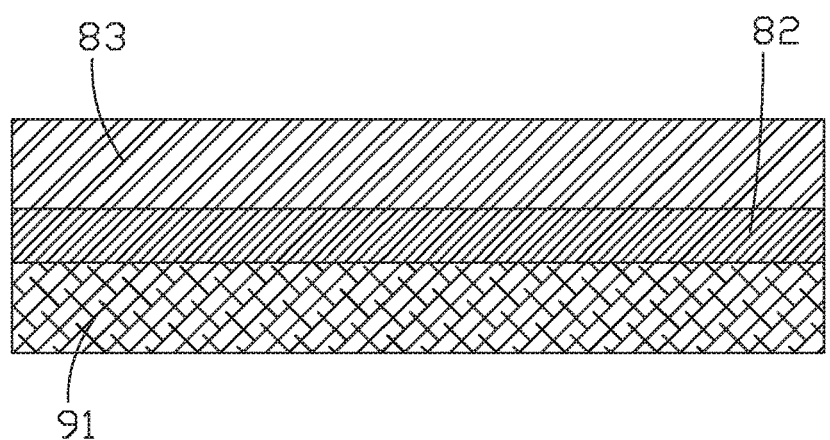
FIG. 4 is an enlarged view of area A' of FIG. 3.

Referring to FIGS. 3 and 4, the present invention provides an array substrate structure for use with a touch screen panel, which comprises a base plate 1, a buffer layer 2 formed on the base plate 1, a semiconductor layer 3 formed on the buffer layer 2, a gate insulation layer 41 formed on the buffer layer 2 and the semiconductor layer 3, an interlayer dielectric layer 42 formed on the gate insulation layer 41, a source/drain terminal 5 formed on the interlayer dielectric layer 42, a planarization layer 6 formed on the source/drain terminal 5 and the interlayer dielectric layer 42, a second metal layer 7 formed on the planarization layer 6, a first insulation layer 81 formed on the second metal layer 7 and the planarization layer 6, a common electrode 91 formed on the first insulation layer 81, a reduction resistant layer 82 formed on the common electrode 91 and the first insulation layer 81, a second insulation layer 83 formed on the reduction resistant layer 82, and a pixel electrode 92 formed on the second insulation layer 83.

A first via 51 is formed in the gate insulation layer 41 and the interlayer dielectric layer 42 to correspond to the semiconductor layer 3. A second via 52 is formed in the first insulation layer 81 to correspond to the second metal layer 7. A third via 53 is formed in the planarization layer 6, the first insulation layer 81, the reduction resistant layer 82, and the second insulation layer 83 to correspond to the source/drain terminal 5.

The semiconductor layer 3 comprises a source/drain contact zone 31 and the source/drain terminal 5 is set in engagement with the source/drain contact zone 31 of the semiconductor layer 3 through the first via 51. The common electrode 91 is set in engagement with the second metal layer 7 through the second via 52. The pixel electrode 92 is set in engagement with the source/drain terminal 5 through the third via 53.

Specifically, the first insulation layer 81 and the second insulation layer 83 comprise a material of $SiN_x$, $x>0$.

The reduction resistant layer 82 comprises a material of $SiN_xO_y$ (silicon oxynitride, $x \geq 0$, $0 \leq y \leq 2$) having a composition that is variable in such a way that in a direction from the common electrode 91 towards the second insulation layer 83, x gradually increases from 0 and y gradually decreases from 2 to 0. In other words, the composition of the reduction resistant layer 82 varies from an interface thereof with the common electrode 91 to become that identical to the second insulation layer 83 so as to facilitate improve a bonding strength between the reduction resistant layer 82 and the second insulation layer 83.

The source/drain contact zone 31 of the semiconductor layer 3 comprises a material of N-type heavily-doped silicon (N+Si).

The common electrode 91 and the pixel electrode 92 both comprise a material of ITO (Indium Tin Oxide).

Specifically, the second metal layer 7 is provided for connection with a touch sensing electrode.

In the above-described array substrate structure, before the second insulation layer is deposited, a reduction resistant layer is first deposited on the common electrode in order to prevent film quality of the common electrode from being affected by a reductive atmosphere generated in a process of directly depositing the second insulation layer on the common electrode and to provide the common electrode with an increased transmittal.

Figure 5:
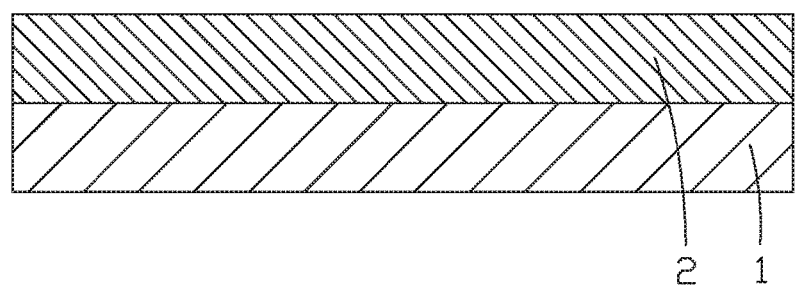
FIG. 5 is a schematic view illustrating a first step of a manufacturing method of an array substrate structure according to the present invention.

Referring to FIG. 3, in combination with FIGS. 5-14, the present invention also provides a manufacturing method of an array substrate structure, which comprises the following steps:

Step 1: as shown in FIG. 5, providing a base plate 1 and depositing a buffer layer 2 on the base plate 1.

Figure 6:
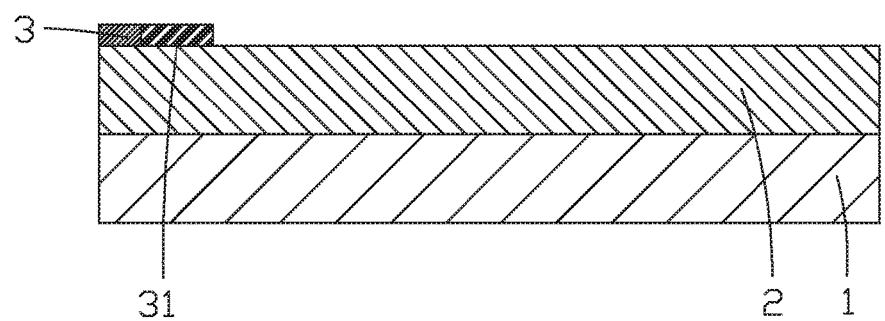
FIG. 6 is a schematic view illustrating a second step of the manufacturing method of the array substrate structure according to the present invention.

Step 2: as shown in FIG. 6, depositing and patterning a semiconductor layer 3 on the buffer layer 2 and subjecting a partial area of the semiconductor layer 3 to N-type heavy doping so as to form a source/drain contact zone 31 for contact engagement with a source/drain terminal.

Specifically, the source/drain contact zone 31 of the semiconductor layer 3 comprises a material of N-type heavily-doped silicon (N+Si).

Figure 7:
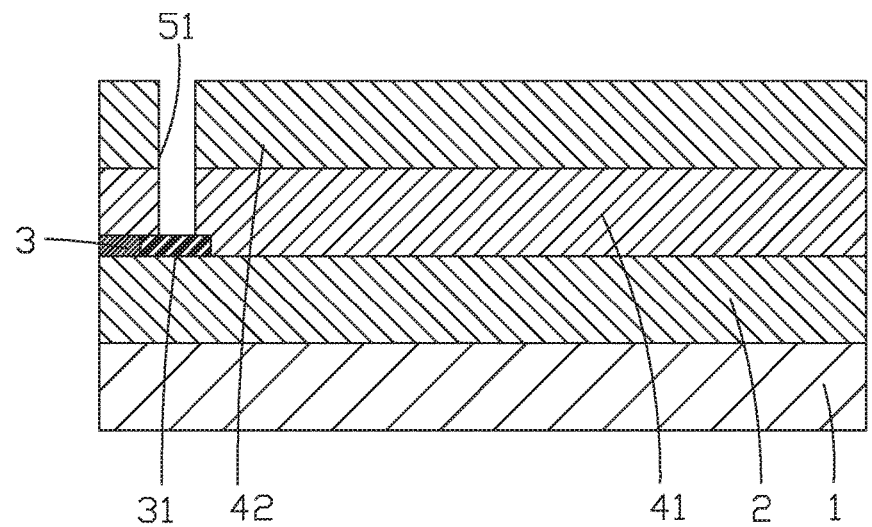
FIG. 7 is a schematic view illustrating a third step of the manufacturing method of the array substrate structure according to the present invention.

Step 3: as shown in FIG. 7, sequentially depositing a gate insulation layer 41 and an interlayer dielectric layer 42 on the semiconductor layer 3 and subjecting the gate insulation layer 41 and the interlayer dielectric layer 42 to patterning so as to form a first via 51 in the gate insulation layer 41 and the interlayer dielectric layer 42 to correspond to the source/drain contact zone 31 of the semiconductor layer 3.

Figure 8:
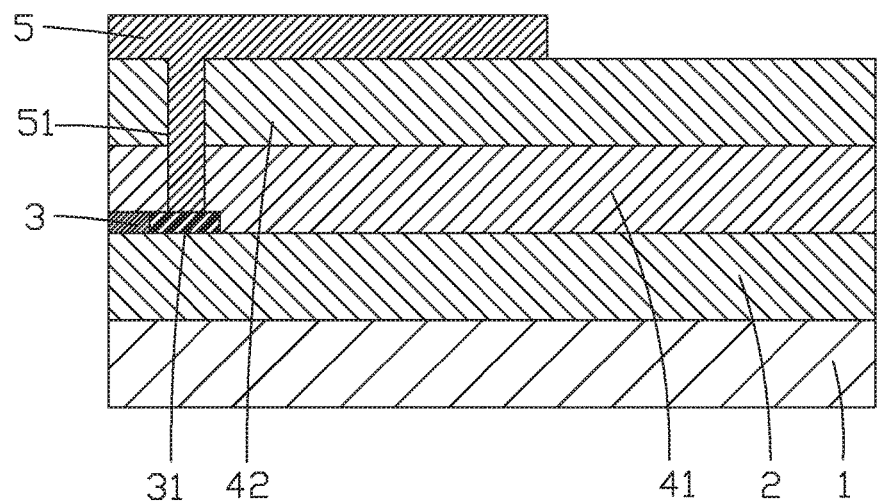
FIG. 8 is a schematic view illustrating a fourth step of the manufacturing method of the array substrate structure according to the present invention.

Step 4: as shown in FIG. 8, depositing and patterning a first metal layer on the interlayer dielectric layer 42 so as to form a source/drain terminal 5, wherein the source/drain terminal 5 is set in engagement with the source/drain contact zone 31 of the semiconductor layer 3 through the first via 51.

Figure 9:
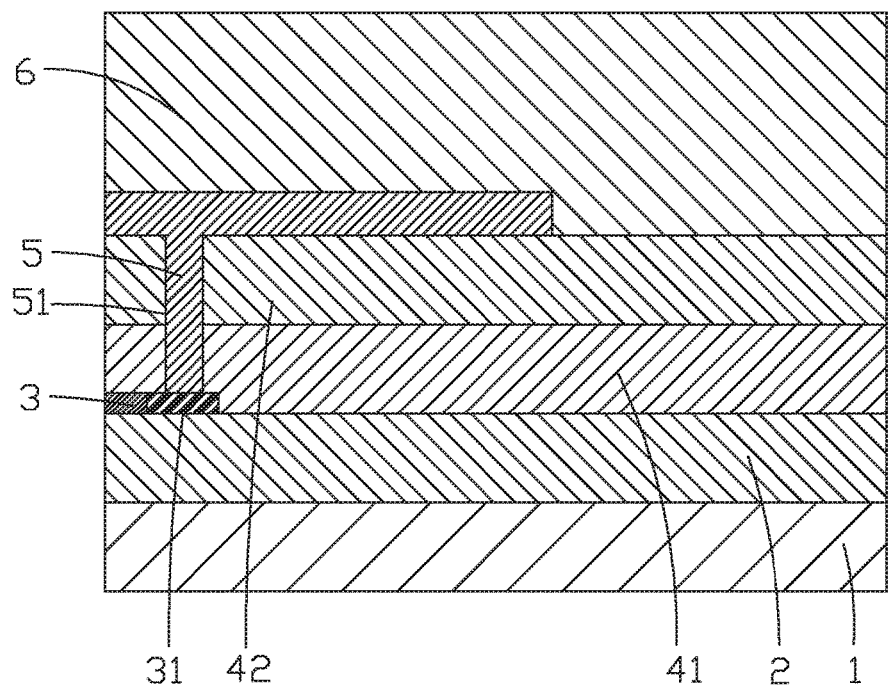
FIG. 9 is a schematic view illustrating a fifth step of the manufacturing method of the array substrate structure according to the present invention.

Step 5: as shown in FIG. 9, depositing a planarization layer 6 on the source/drain terminal 5 and the interlayer dielectric layer 42.

Figure 10:
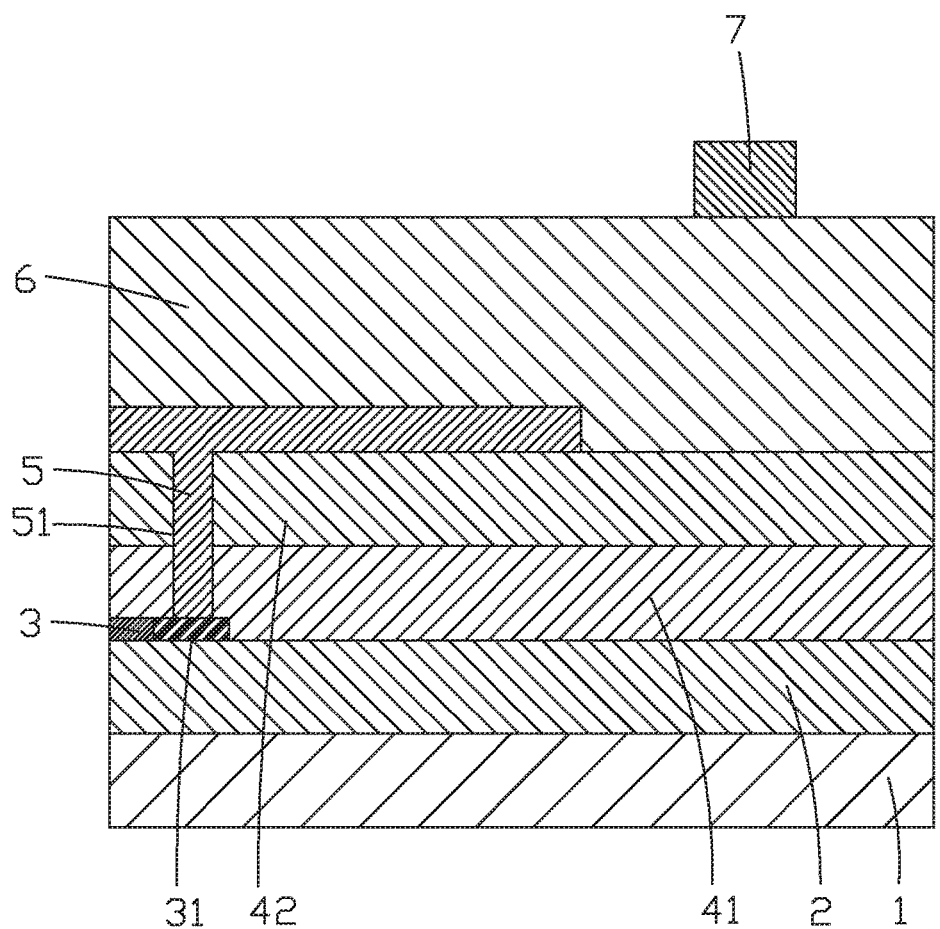
FIG. 10 is a schematic view illustrating a sixth step of the manufacturing method of the array substrate structure according to the present invention.

Step 6: as shown in FIG. 10, depositing and patterning a second metal layer 7 on the planarization layer 6.

Specifically, the second metal layer 7 is provided for connection with a touch sensing electrode.

Figure 11:
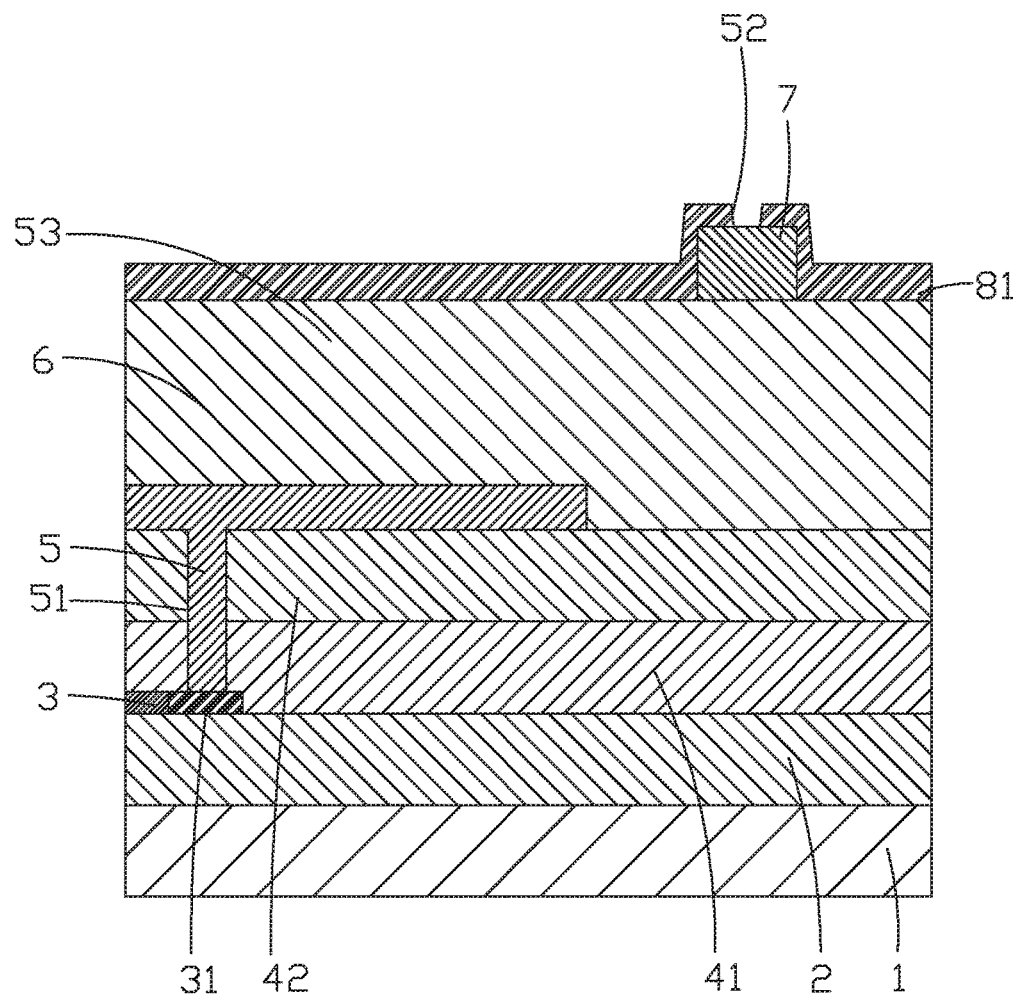
FIG. 11 is a schematic view illustrating a seventh step of the manufacturing method of the array substrate structure according to the present invention.

Step 7: as shown in FIG. 11, depositing and patterning a first insulation layer 81 on the second metal layer 7 and the planarization layer 6 so as to form a second via 52 in the first insulation layer 81 to correspond to the second metal layer 7.

Specifically, plasma enhanced chemical vapor deposition (PECVD) is used to form the first insulation layer 81.

Specifically, the first insulation layer 81 comprises a material of $SiN_x$, x>0.

Figure 12:
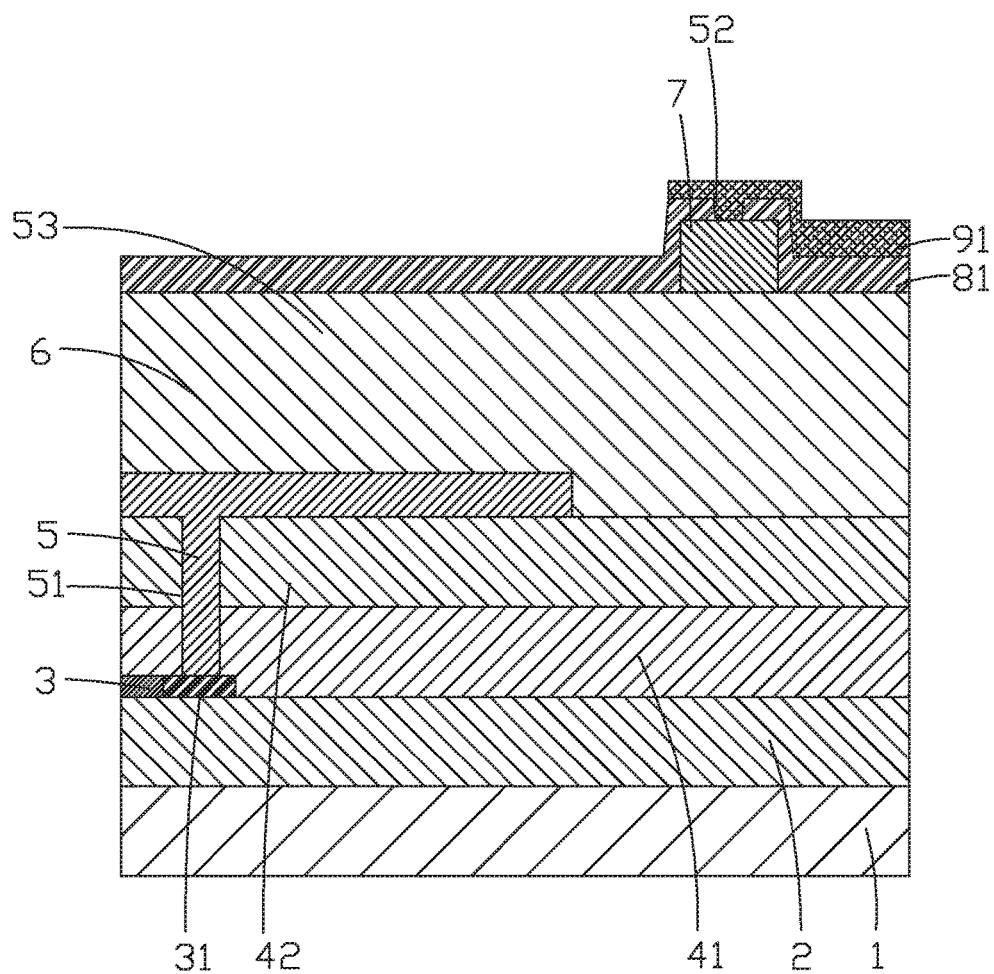
FIG. 12 is a schematic view illustrating an eighth step of the manufacturing method of the array substrate structure according to the present invention.

Step 8: as shown in FIG. 12, depositing and patterning a first oxide conductive layer on the first insulation layer 81 so as to form a common electrode 91, wherein the common electrode 91 is set in engagement with the second metal layer 7 through the second via 52.

Specifically, the common electrode 91 comprises a material of ITO (Indium Tin Oxide).

Figure 13:
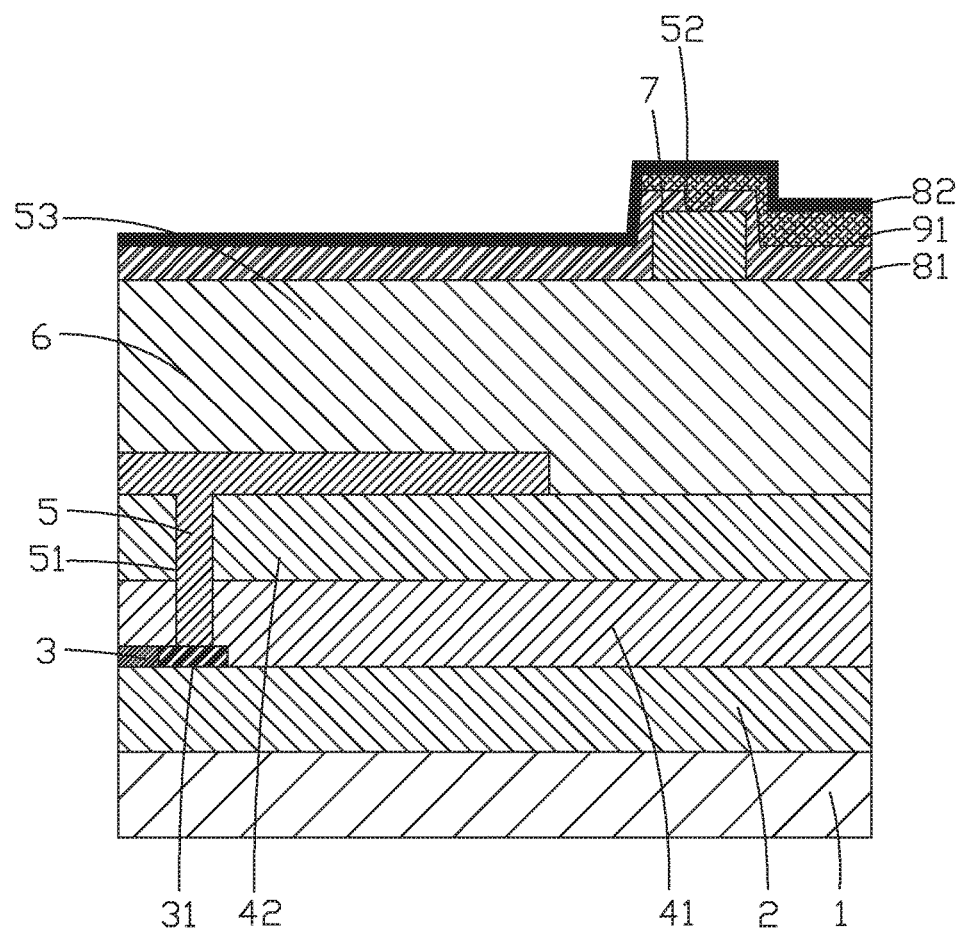
FIG. 13 is a schematic view illustrating a ninth step of the manufacturing method of the array substrate structure according to the present invention.

Step 9: as shown in FIG. 13, depositing a reduction resistant layer 82 on the common electrode 91 and the first insulation layer 81.

Specifically, PECVD is used to form the reduction resistant layer 82.

Specifically, Step 9 comprises the following steps:

Step 91: supplying a gas for deposition of $SiO_2$ to a surface of the common electrode 91 so as to form a $SiO_2$ film; and Step 92: slowly cutting off the supply of the gas for deposition of $SiO_2$ and at the same time, gradually conducting a supply of a gas for deposition of $SiN_x$ in such a way that the supply of the gas for deposition of $SiO_2$ is gradually reduced to zero and at the same time, the supply of the gas for deposition of $SiN_x$ is gradually increased so that a composition-variable $SiN_xO_y$ layer (x≥0, 0≤y≤2) is formed on the common electrode 91 wherein in a direction in which the growth is made upward from the common electrode 91, x increases from 0 and y decreases from 2 to 0, the composition-variable $SiN_xO_y$ layer being the reduction resistant layer 82.

Specifically, the gas for deposition of $SiO_2$ comprises TEOS (Tetraethyl Orthosilicate) and $O_2$ (Oxygen). TEOS and $O_2$ react under an effect of an electromagnetic field generated by radio frequency (RF) power to generate $SiO_2$ is demonstrated as follows:

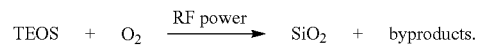

Specifically, the gas for deposition of $SiN_x$ comprises $SiH_4$ (silane), $NH_3$ (ammonia), and $N_2$ (nitrogen). $SiH_4$, $NH_3$, and $N_2$ react under an effect of an electromagnetic field generated by radio frequency (RF) power to generate $SiN_x$ is demonstrated as follows:

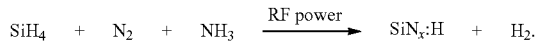

Figure 14:
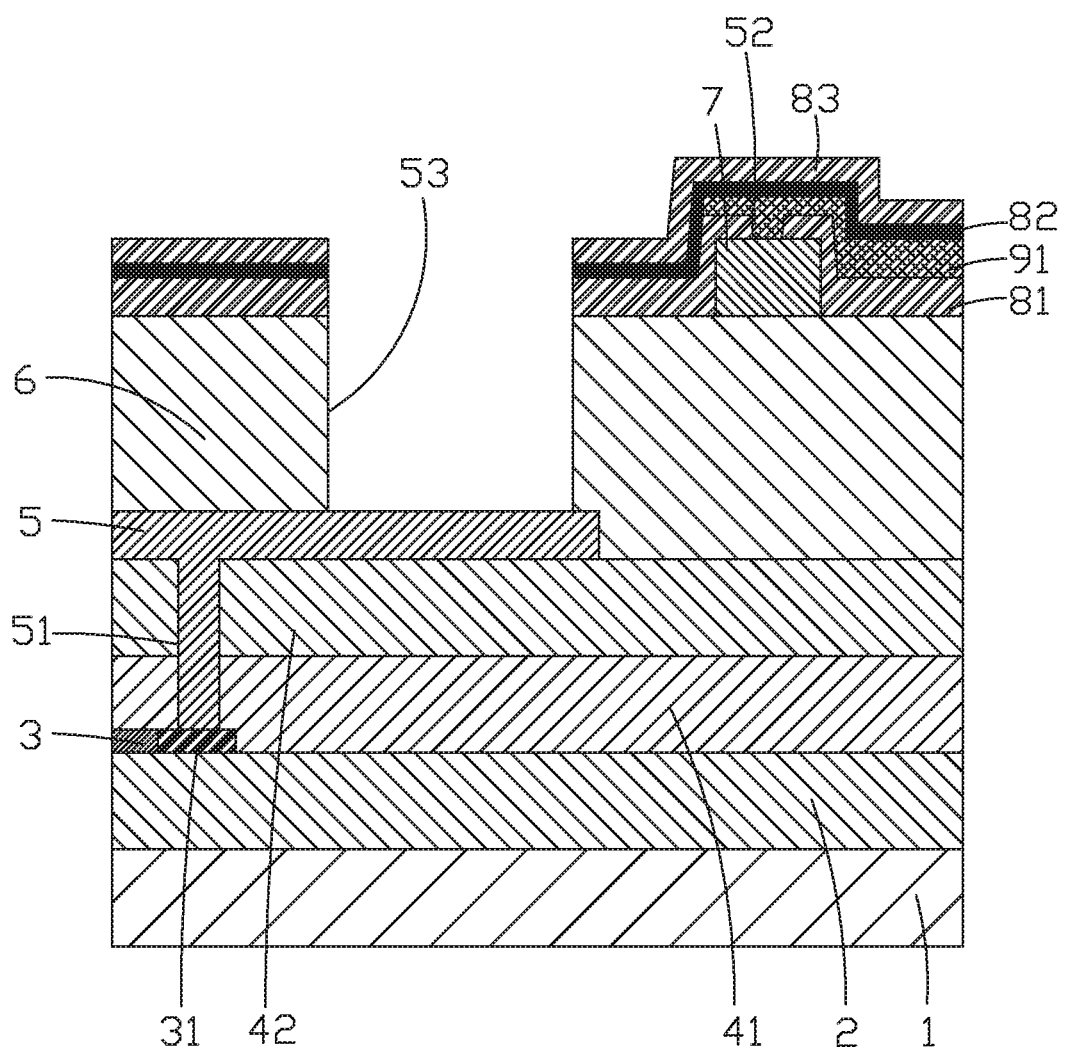
FIG. 14 is a schematic view illustrating a tenth step of the manufacturing method of the array substrate structure according to the present invention.

Step 10: as shown in FIG. 14, depositing a second insulation layer 83 on the reduction resistant layer 82 and simultaneously subjecting the second insulation layer 83, the reduction resistant layer 82, the first insulation layer 81, and the planarization layer 6 to patterning so as to form a third via 53 in the second insulation layer 83, the reduction resistant layer 82, the first insulation layer 81, and the planarization layer 6 to correspond to the source/drain terminal 5.

Specifically, PECVD is used to form the second insulation layer 83.

Specifically, the second insulation layer 83 comprises a material of $SiN_x$, x>0.

It is noted here that the second insulation layer 83 can be formed in the same operation with the reduction resistant layer 82 in order to obtain a high manufacturing efficiency.

Step 11: as shown in FIG. 3, depositing and patterning a second oxide conductive layer on the second insulation layer 83 so as to form a pixel electrode 92, wherein the pixel electrode 92 is set in engagement with the source/drain terminal 5 through the third via 53.

Specifically, the pixel electrode 92 comprises a material of ITO (Indium Tin Oxide).

In the above-described manufacturing method of an array substrate structure, after a common electrode is formed, a reduction resistant layer is first formed on the common electrode before deposition of a second insulation layer in order to prevent film quality of the common electrode from being affected by a reductive atmosphere generated in the process of depositing the second insulation layer on the common electrode thereby reducing the influence of the common electrode caused by the deposition of insulation layer on the common electrode and providing the common electrode with an increased transmittal and enhancing displaying performance.

In summary, the present invention provides an array substrate structure, in which a reduction resistant layer is arranged on the common electrode in order to prevent film quality of the common electrode from being affected by a reductive atmosphere generated in a process of directly depositing a second insulation layer on the common electrode and to provide the common electrode with an increased transmittal. The present invention provides a manufacturing method of the array substrate structure, in which after a common electrode is formed, a reduction resistant layer is first formed on the common electrode before deposition of a second insulation layer in order to prevent film quality of the common electrode from being affected by a reductive atmosphere generated in the process of depositing the second insulation layer on the common electrode thereby reducing the influence of the common electrode caused by the deposition of insulation layer on the common electrode and providing the common electrode with an increased transmittal and enhancing displaying performance.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of an array substrate structure, comprising the following steps:
   (1) providing a base plate and depositing a buffer layer on the base plate;
   (2) depositing and patterning a semiconductor layer on the buffer layer and subjecting a partial area of the semiconductor layer to N-type heavy doping so as to form a source/drain contact zone for contact engagement with a source/drain terminal;
   (3) sequentially depositing a gate insulation layer and an interlayer dielectric layer on the semiconductor layer and subjecting the gate insulation layer and the interlayer dielectric layer to patterning so as to form a first via in the gate insulation layer and the interlayer dielectric layer to correspond to the source/drain contact zone of the semiconductor layer;
   (4) depositing and patterning a first metal layer on the interlayer dielectric layer so as to form a source/drain terminal, wherein the source/drain terminal is set in engagement with the source/drain contact zone of the semiconductor layer through the first via;
   (5) depositing a planarization layer on the source/drain terminal and the interlayer dielectric layer;
   (6) depositing and patterning a second metal layer on the planarization layer;
   (7) depositing and patterning a first insulation layer on the second metal layer and the planarization layer so as to form a second via in the first insulation layer to correspond to the second metal layer;
   (8) depositing and patterning a first oxide conductive layer on the first insulation layer so as to form a common electrode, wherein the common electrode is set in engagement with the second metal layer through the second via;
   (9) depositing a reduction resistant layer on the common electrode and the first insulation layer;
   (10) depositing a second insulation layer on the reduction resistant layer and simultaneously subjecting the second insulation layer, the reduction resistant layer, the first insulation layer, and the planarization layer to patterning so as to form a third via in the second insulation layer, the reduction resistant layer, the first insulation layer, and the planarization layer to correspond to the source/drain terminal; and
   (11) depositing and patterning a second oxide conductive layer on the second insulation layer so as to form a pixel electrode, wherein the pixel electrode is set in engagement with the source/drain terminal through the third via.

2. The manufacturing method of the array substrate structure as claimed in claim 1, wherein the first insulation layer and the second insulation layer comprises a material of $SiN_x$, $x>0$.

3. The manufacturing method of the array substrate structure as claimed in claim 1, wherein in step (9), plasma enhanced chemical vapor deposition (PECVD) is used to form the reduction resistant layer.

4. The manufacturing method of the array substrate structure as claimed in claim 3, wherein the source/drain contact zone of the semiconductor layer comprises a material of N-type heavily-doped silicon; and the common electrode and the pixel electrode comprise a material of indium tin oxide (ITO).

5. The manufacturing method of the array substrate structure as claimed in claim 3, wherein step (9) comprises:
   (91) supplying a gas for deposition of $SiO_2$ to a surface of the common electrode so as to form a $SiO_2$ film; and
   (92) slowly cutting off the supply of the gas for deposition of $SiO_2$ and at the same time, gradually conducting a supply of a gas for deposition of $SiN_x$ in such a way that the supply of the gas for deposition of $SiO_2$ is gradually reduced to zero and at the same time, the supply of the gas for deposition of $SiN_x$ is gradually increased so that a composition-variable $SiN_xO_y$ layer, $x \geq 0$, $0 \leq y \leq 2$, is formed on the common electrode, wherein in a direction in which growth is made upward from the common electrode, x increases from 0 and y decreases from 2 to 0, the composition-variable $SiN_xO_y$ layer being the reduction resistant layer.

6. The manufacturing method of the array substrate structure as claimed in claim 5, wherein the gas for deposition of $SiO_2$ comprises tetraethyl orthosilicate (TEOS) and oxygen ($O_2$) and the gas for deposition of $SiN_x$ comprises $SiH_4$, $NH_3$, and $N_2$.

* * * * *